(12) United States Patent
Tsukamoto

(10) Patent No.: US 10,224,899 B2
(45) Date of Patent: Mar. 5, 2019

(54) HIGH-FREQUENCY FILTER, FRONT-END CIRCUIT, AND COMMUNICATION DEVICE

(71) Applicant: Murata Manufacturing Co., Ltd., Kyoto (JP)

(72) Inventor: Hideki Tsukamoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/718,354

(22) Filed: Sep. 28, 2017

(65) Prior Publication Data

US 2018/0019729 A1 Jan. 18, 2018

Related U.S. Application Data

(63) Continuation of application No. PCT/JP2016/060132, filed on Mar. 29, 2016.

(30) Foreign Application Priority Data

Mar. 30, 2015 (JP) .................................. 2015-068770

(51) Int. Cl.
*H03H 9/50* (2006.01)
*H01P 1/20* (2006.01)
(Continued)

(52) U.S. Cl.
CPC ................ *H03H 9/50* (2013.01); *H01P 1/20* (2013.01); *H03H 7/0161* (2013.01);
(Continued)

(58) Field of Classification Search
CPC .......... H03H 9/50; H03H 9/64; H03H 7/0161; H03H 9/72; H03H 9/703; H03H 7/075;
(Continued)

(56) References Cited

U.S. PATENT DOCUMENTS

2005/0212612 A1   9/2005   Kawakubo
2006/0154628 A1*  7/2006   Mochizuki ........... H04B 1/1027
                                                  455/134
(Continued)

FOREIGN PATENT DOCUMENTS

JP   H04-373288 A   12/1992
JP   2005-217852 A   8/2005
(Continued)

OTHER PUBLICATIONS

International Search Report issued in Application No. PCT/JP2016/060132 dated Jun. 21, 2016.
(Continued)

*Primary Examiner* — Eugene Yun
(74) *Attorney, Agent, or Firm* — Pearne & Gordon LLP

(57) ABSTRACT

A high-frequency filter includes a variable frequency filter, a fixed frequency filter, and switches. The variable frequency filter varies a passband in association with frequencies used in multiple communication band. The fixed frequency filter fixes a passband in association with a frequency used in a specific communication band different from the multiple communication bands. The switches are used to switch connection configuration to the variable frequency filter or the fixed frequency filter.

15 Claims, 12 Drawing Sheets

(51) Int. Cl.
*H03H 7/075* (2006.01)
*H03H 9/64* (2006.01)
*H04B 1/52* (2015.01)
*H04B 1/00* (2006.01)
*H03H 7/01* (2006.01)
*H03H 9/70* (2006.01)
*H03H 9/72* (2006.01)

(52) U.S. Cl.
CPC .............. *H03H 7/075* (2013.01); *H03H 9/64* (2013.01); *H03H 9/703* (2013.01); *H03H 9/72* (2013.01); *H04B 1/0057* (2013.01); *H04B 1/52* (2013.01); *H03H 2210/012* (2013.01); *H03H 2210/025* (2013.01); *H03H 2250/00* (2013.01)

(58) Field of Classification Search
CPC ....... H03H 2210/025; H03H 2210/012; H03H 2250/00; H04B 1/0057; H04B 1/52; H01P 1/20
USPC .......................................................... 455/78
See application file for complete search history.

(56) References Cited

U.S. PATENT DOCUMENTS

2008/0247115 A1 10/2008 Lee
2011/0199168 A1 8/2011 Kadota

FOREIGN PATENT DOCUMENTS

| JP | 4053504 B2 | 2/2008 |
| JP | 2008-277743 A | 11/2008 |
| JP | 2009-130831 A | 6/2009 |
| JP | 2012-253507 A | 12/2012 |
| JP | 2013-066250 A | 4/2013 |

OTHER PUBLICATIONS

Written Opinion issued in Application No. PCT/JP2016/060132 dated Jun. 21, 2016.

* cited by examiner

HIGH-FREQUENCY FILTER, FRONT-END CIRCUIT, AND COMMUNICATION DEVICE This is a continuation of International Application No. PCT/JP2016/060132 filed on Mar. 29, 2016 which claims priority from Japanese Patent Application No. 2015-068770 filed on Mar. 30, 2015. The contents of these applications are incorporated herein by reference in their entireties.

BACKGROUND

Technical Field

The present disclosure relates to a high-frequency filter that performs filtering of high-frequency signals in multiple communication bands, a front-end circuit, and a communication device.

Various variable filter circuits have hitherto been devised, which are capable of adjusting the frequencies of a passband and an attenuation pole using a resonator having a resonant frequency and an anti-resonant frequency and a variable capacitor (for example, refer to Patent Document 1 and Patent Document 2).

Each of the variable filter circuits described in Patent Document 1 and Patent Document 2 has a ladder structure in which series arms provided between input-output terminals and parallel arms provided between the series arms and ground are alternately connected. A resonant circuit is provided for each of the series arms and the parallel arms. The resonant circuit includes a resonator having the resonant frequency and the anti-resonant frequency and a variable capacitor connected in series or in parallel to the resonator. Each resonant circuit is capable of adjusting the resonant frequency and the anti-resonant frequency by controlling the variable capacitor provided for the resonant circuit. Since the frequencies of the passband and the attenuation pole in the variable filter circuit are defined in accordance with the resonant frequency and the anti-resonant frequency in each resonant circuit, the frequencies of the passband and the attenuation pole are capable of being adjusted by controlling the variable capacitor.

Patent Document 1: Japanese Unexamined Patent Application Publication No. 2009-130831
Patent Document 2: Japanese Patent No. 4053504

BRIEF SUMMARY

Since the variable filter circuit is capable of adjusting the frequencies of the passband and the attenuation pole, the variable filter circuit is decreased in size when the variable filter circuit is associated with multiple communication bands, compared with a case in which multiple fixed frequency filters are mounted for the multiple communication bands.

However, attenuation characteristics near the passband are generally degraded in the variable filter circuit, compared with those of a fixed filter circuit in which the frequencies of the passband and the attenuation pole are fixed. Accordingly, when the variable filter circuit is used in, for example, a communication apparatus that processes signals in multiple communication bands, it may be difficult to realize appropriate filter characteristics with the variable filter circuit depending on the frequency band of the signals to be processed. For example, it is difficult to realize appropriate filter characteristics with the variable filter circuit for communication bands, such as Band8, Band20, and Band26, in a Long Term Evolution (LTE) communication system or a Wideband Code Division Multiple Access (WCDMA) (registered trademark) communication system.

Accordingly, the present disclosure provides a high-frequency filter capable of realizing filtering appropriate for each communication band while realizing a reduction in size, a front-end circuit, and a communication device.

A variable frequency filter of the present disclosure has the following configuration. A high-frequency module of the present disclosure has a configuration similar to the following configuration.

The present disclosure provides a high-frequency filter including a variable frequency filter, a fixed frequency filter, and a switch. The variable frequency filter varies a passband in association with frequencies used in multiple communication bands. The fixed frequency filter fixes a passband in association with a frequency used in a specific communication band different from the multiple communication bands. The switch is used to switch connection configuration to the variable frequency filter or the fixed frequency filter.

With the above configuration, the variable frequency filter and the fixed frequency filter are capable of being switched with the switch to use the variable frequency filter or the fixed frequency filter. When the high-frequency filter is used as the variable frequency filter, the frequencies of a passband and an attenuation pole are capable of being adjusted. When the high-frequency filter is used as the fixed frequency filter, the frequencies of a passband and an attenuation pole are fixed. In general, the attenuation characteristics near the passband are capable of being improved in the filter circuit in which the frequencies of the passband and the attenuation pole are fixed, compared with the filter circuit in which the frequencies of the passband and the attenuation pole are varied. Accordingly, with the above high-frequency filter, it is possible to improve the attenuation characteristics near the passband with the fixed frequency filter in setting of the passband to specific frequencies (it is not easy to address the attenuation characteristics with the variable frequency filter) while varying the frequencies of the passband and the attenuation pole.

The high-frequency filter of the present disclosure may have a configuration in which the fixed frequency filter includes no variable reactance element and the variable frequency filter includes a variable reactance element.

With the above configuration, it is easy to achieve both the variability of the passband of the variable frequency filter and the filter characteristics of the fixed frequency filter.

The high-frequency filter of the present disclosure may have the following configuration. The high-frequency filter further includes at least one filter characteristics adjusting circuit that selectively connect a capacitor having a fixed capacitance to the fixed frequency filter or the variable frequency filter and the filter characteristics adjusting circuit is connected to at least one end of the fixed frequency filter.

With the above configuration, the filter characteristics are partially adjusted without necessarily almost varying basic filter characteristics (for example, insertion loss in the passband) in the filter characteristics of the fixed frequency filter.

In the high-frequency filter of the present disclosure, the variable frequency filter may include a first circuit portion having basic frequency characteristics and a second circuit portion that selectively connects a capacitor to the first circuit portion to adjust the basic frequency characteristics.

With the above configuration, the filter characteristics of the variable frequency filter are improved.

In the high-frequency filter described above, the fixed frequency filter may be composed so as to include a first series-arm resonant circuit, which includes no variable reactance element. The fixed frequency filter may be composed so as to include a parallel-arm resonant circuit, which includes a variable reactance element.

The variable frequency filter may be composed so as to include a second series-arm resonant circuit, which includes a variable reactance element. The variable frequency filter may be composed so as to include a parallel-arm resonant circuit, which includes a variable reactance element. The variable frequency filter may be composed so as to include a reactance circuit with which the multiple parallel-arm resonant circuits are connected.

The parallel-arm resonant circuit described above may be shared between the fixed frequency filter and the variable frequency filter. This enables the frequencies of the passband and the attenuation pole to be fine-tuned by controlling the variable reactance element in the parallel-arm resonant circuit when the high-frequency filter is used as the fixed frequency filter.

The reactance circuit described above may have a configuration in which multiple reactance elements having different reactance values are switched and connected. With this configuration, the filter characteristics are capable of being adjusted through switching of the reactance value in the reactance circuit.

According to the present disclosure, it is possible to realize filtering appropriate for each communication band to be subjected to the filtering.

DETAILED DESCRIPTION

First Embodiment

Figure 1:
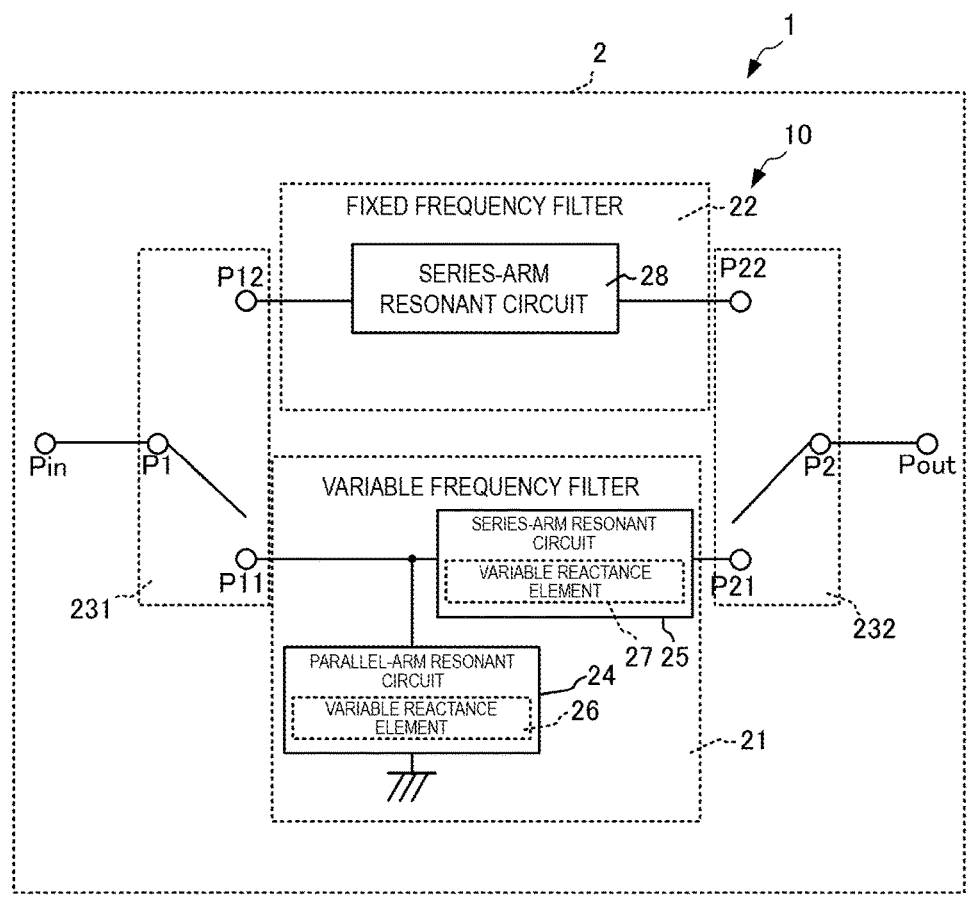
FIG. 1 is a block diagram of a high-frequency module according to a first embodiment.

FIG. 1 is a block diagram illustrating a high-frequency module composing a high-frequency filter according to a first embodiment of the present disclosure.

A high-frequency module 1 includes a substrate 2 configured as, for example, a printed wiring board. The substrate 2 includes integrated components, surface mount devices, and internal wiring patterns, which are not illustrated and which compose a high-frequency filter 10.

The high-frequency filter 10 includes input-output terminals Pin and Pout, switches 231 and 232, a variable frequency filter 21, and a fixed frequency filter 22. The switches 231 and 232 correspond to a "switch" of the present disclosure.

The switch 231 includes a common terminal P1 and connection switching terminals P11 and P12. The common terminal P1 is connected to the input-output terminal Pin. One of the connection switching terminal P11 and the connection switching terminal P12 is selectively connected to the common terminal P1. The switch 232 includes a common terminal P2 and connection switching terminals P21 and P22. The common terminal P2 is connected to the input-output terminal Pout. One of the variable frequency filter 21 and the connection switching terminal P22 is selectively connected to the common terminal P2. The connection switching terminals P11 and P21 are connected to the common terminals P1 and P2, respectively, in synchronization with each other. The connection switching terminals P12 and P22 are also connected to the common terminals P1 and P2, respectively, in synchronization with each other.

The variable frequency filter 21 is connected between the connection switching terminals P11 and P21. The fixed frequency filter 22 is connected between the connection switching terminals P12 and P22. When the variable frequency filter 21 is selected, the switches 231 and 232 are controlled to connect the common terminal P1 to the connection switching terminal P11 and to connect the common terminal P2 to the connection switching terminal P21. This causes the variable frequency filter 21 to be connected between the common terminals P1 and P2. When the fixed frequency filter 22 is selected, the switches 231 and 232 are controlled to connect the common terminal P1 to the connection switching terminal P12 and to connect the common terminal P2 to the connection switching terminal P22. This causes the fixed frequency filter 22 to be connected between the common terminals P1 and P2.

The variable frequency filter 21 includes a parallel-arm resonant circuit 24 and a series-arm resonant circuit 25. The parallel-arm resonant circuit 24 includes a variable reactance element 26. The series-arm resonant circuit 25 includes a variable reactance element 27. A passband and an attenuation pole are varied by adjusting the reactances of the variable reactance elements 26 and 27.

Specifically, the reactance of the variable reactance element 26 is varied through control by an external control circuit or the like. The parallel-arm resonant circuit 24 has a resonant frequency and an anti-resonant frequency. At least one of the resonant frequency and the anti-resonant frequency is capable of being adjusted by controlling the variable reactance element 26. The parallel-arm resonant circuit 24 may include multiple variable reactance elements 26 to enable both the resonant frequency and the anti-resonant frequency in the parallel-arm resonant circuit 24 to be adjusted. The parallel-arm resonant circuit 24 has a function to increase the attenuation at the resonant frequency and decrease the attenuation at the anti-resonant frequency in filter characteristics of the variable frequency filter 21. The reactance of the variable reactance element 27 is varied through control by an external control circuit or the like. The series-arm resonant circuit 25 has the resonant frequency and the anti-resonant frequency. At least one of the resonant frequency and the anti-resonant frequency is capable of being adjusted by controlling the variable reactance element 27. The series-arm resonant circuit 25 may include multiple variable reactance elements 27 to enable both the resonant frequency and the anti-resonant frequency in the series-arm resonant circuit 25 to be adjusted. The series-arm resonant circuit 25 has a function to decrease the attenuation at the resonant frequency and increase the attenuation at the anti-resonant frequency in the filter characteristics of the variable frequency filter 21 when a switching path 11 is connected to a series arm 14 by controlling a switching unit 23 (switch 231, 232).

The variable frequency filter 21 may have any configuration as long as the cutoff frequency of at least the passband is capable of being varied.

The fixed frequency filter 22 includes a series-arm resonant circuit 28 and the passband of the fixed frequency filter 22 is fixed. The fixed frequency filter 22 may have any configuration as long as the fixed passband or attenuation pole of the series-arm resonant circuit 28 described below is capable of being used.

The variable frequency filter 21 performs filtering for multiple communication bands of which the variable frequency filter 21 meets the specifications of the filter characteristics, among the multiple communication bands supported by the high-frequency filter 10. In contrast, the fixed frequency filter 22 performs the filtering for communication bands of which the variable frequency filter 21 has difficulty in meeting the specifications of the filter characteristics, among the multiple communication bands supported by the high-frequency filter 10. For example, when it is necessary to set excellent attenuation characteristics near the passband, the attenuation characteristics near the passband are improved using the fixed frequency filter 22.

Specifically, the fixed frequency filter 22, which does not include the variable reactance element 26, generally has excellent attenuation of an attenuation area and excellent insertion loss, compared with the variable frequency filter 21 including the variable reactance elements 26 and 27. Accordingly, the variable frequency filter 21 capable of supporting the multiple communication bands with one circuit configuration is used for the communication bands of which the variable frequency filter 21 meets the filter characteristics, and the fixed frequency filter 22 having more excellent filter characteristics is used for the communication bands of which the variable frequency filter 21 has difficulty in meeting the filter characteristics. This enables the filtering for the multiple communication bands requiring different filter characteristics to be realized without necessarily increasing the size of the high-frequency filter 10.

Exemplary combinations of communication bands to be associated with the variable frequency filter 21 and the fixed frequency filter 22 when the high-frequency filter 10 is applied to signal processing in an LTE communication system will now be described.

Figure 2A:
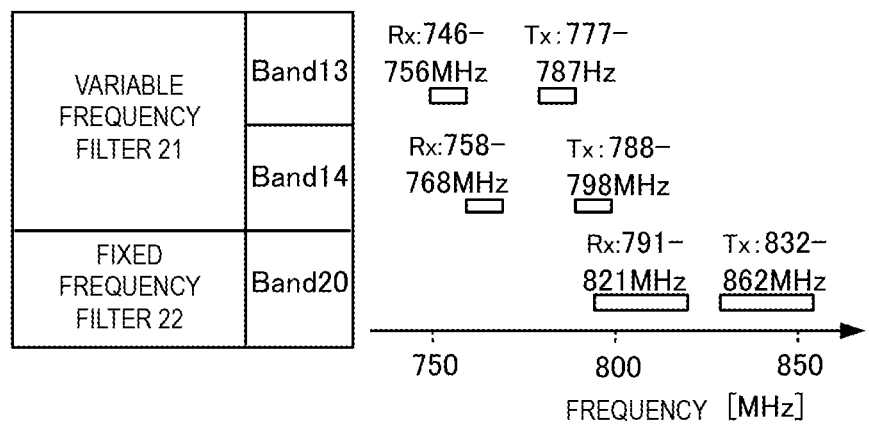
FIGS. 2A-2C include schematic diagrams for describing filter characteristics in a variable filter circuit according to the first embodiment.

FIG. 2A is a diagram for describing the communication bands to be associated with the variable frequency filter 21 and the fixed frequency filter 22.

The variable frequency filter 21 is associated with transmission bands of Band13 and Band14, which are defined in the LTE communication system. In other words, the frequency range in which the passband of the variable frequency filter 21 is capable of being adjusted is set to the transmission bands of Band13 and Band14. The fixed frequency filter 22 is associated with a transmission band of Band 20, which is defined in the LTE communication system. In other words, the passband of the fixed frequency filter 22 is set to the transmission band of Band20.

The communication bandwidths of the transmission band and the reception band of each of Band13 and Band14 are set to around 10 MHz. A gap bandwidth between the transmission band and the reception band of each of Band13 and Band14 is set to around 20 to 21 MHz. Band13 and Band14 are set in a frequency band in which the transmission band of Band13 is close to that of Band14 and the reception band of Band13 is close to that of Band14.

In contrast, the communication bandwidths of the transmission band and the reception band of Band20 are set to around 30 MHz, which is greatly wider than those of Band13 and Band14. The gap bandwidth between the transmission band and the reception band of Band20 is set to around 11 MHz. This gap bandwidth is narrower than the gap bandwidths of Band13 and Band14 and also narrower than the communication bandwidths of the transmission band and the reception band of Band20.

Figure 2B:
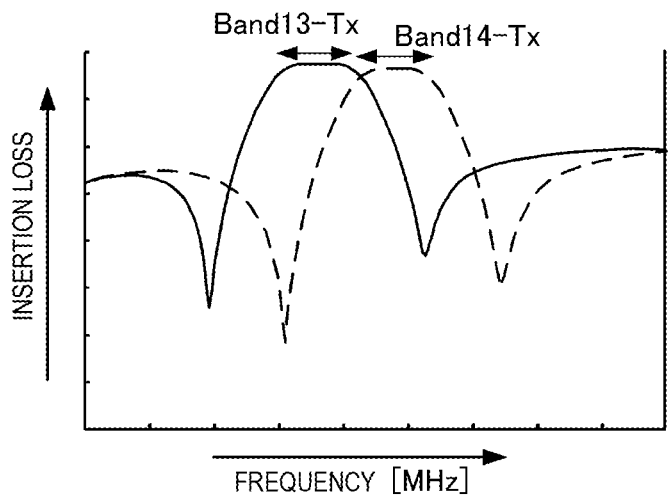

FIG. 2B is a graph illustrating exemplary filter characteristics to be set for the variable frequency filter 21. The filter characteristics of the variable frequency filter 21 exemplified here have the passband, the attenuation pole at the low frequency side of the passband, and the attenuation pole at the high frequency side of the passband. The frequencies of the passband and the attenuation poles are capable of being adjusted by controlling the variable reactance elements.

Since the bandwidth of the transmission band of each of Band13 and Band14 illustrated in FIG. 2A is relatively narrow and the transmission band of Band13 is close to the transmission band of Band14, the transmission bands are easily fit into the frequency range in which the passband in the variable frequency filter 21 is capable of being adjusted. Accordingly, the passband and the attenuation characteristics appropriate for each communication band can be realized by controlling the variable reactance elements 26 and 27 in the variable frequency filter 21 for these multiple reception bands.

Figure 2C:
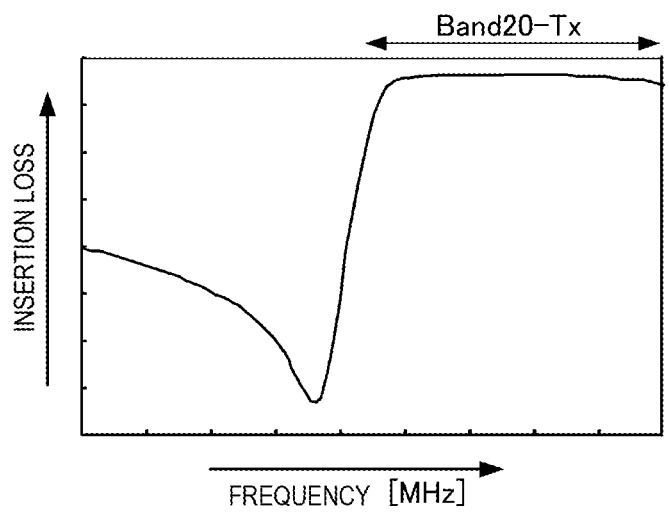

FIG. 2C is a graph illustrating an exemplary filter characteristic of the fixed frequency filter 22. The filter characteristic of the fixed frequency filter 22 exemplified here has the passband, the attenuation pole at the low frequency side of the passband, and the attenuation pole at the high frequency side of the passband (not illustrated) and the frequencies of the passband and the attenuation poles are not varied.

As illustrated in FIG. 2A, since the gap bandwidth in Band20 is narrower than the gap bandwidths of the other communication bands and is also narrower than the communication bandwidths of Band20, it is difficult to realize excellent attenuation characteristics in the gap frequency band of Band20 even when the passband is to be set to Band20 through the frequency adjustment in the variable frequency filter 21 described above. Accordingly, the passband of the fixed frequency filter 22 is set so as to correspond to Band20 and the fixed frequency filter 22 is used in the signal processing of a communication signal (high-frequency signal) in Band20. Since the fixed frequency filter 22 does not include the variable reactance element, unlike the variable frequency filter 21, and the passband of the fixed frequency filter 22 is fixed, excellent attenuation characteristics having high sharpness and a high attenuation level are realized even for the narrow gap frequency band, such as that of Band20.

Accordingly, with the high-frequency filter 10, it is possible to realize the passband and the attenuation characteristics appropriate for a communication band that has a wide communication bandwidth and a narrow gap bandwidth, such as Band20 which the variable filter circuits in related art have difficulty in supporting, in the same manner as those in the other communication bands. In contrast, the variable frequency filter capable of varying the filter characteristics is used for the multiple communication bands requests for the filter characteristics to which are not relatively strict. Consequently, application of the high-frequency filter 10 according to the present disclosure to, for example, a communication apparatus that processes multiple communication bands reduces the circuit size of the entire filter circuit, compared with the related art.

Second Embodiment

Figure 3:
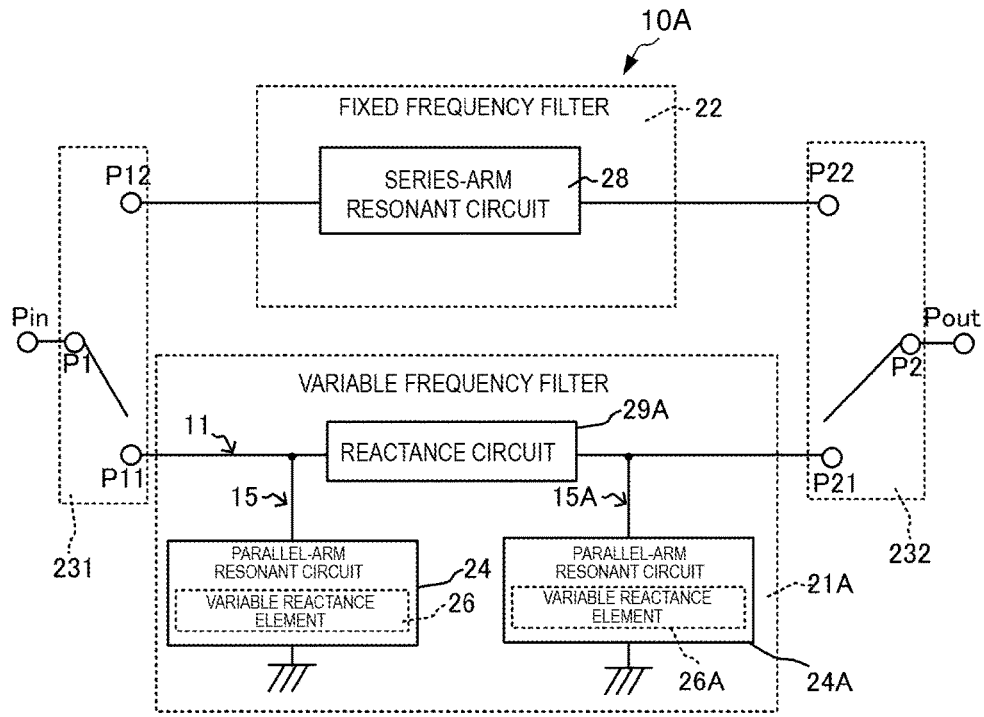
FIG. 3 is a block diagram of a variable filter circuit according to a second embodiment.

FIG. 3 is a block diagram of a high-frequency filter 10A according to a second embodiment of the present disclosure.

The high-frequency filter 10A includes a variable frequency filter 21A as a component different from the components in the first embodiment. The variable frequency filter 21A includes the parallel-arm resonant circuit 24, a parallel-arm resonant circuit 24A, and a reactance circuit 29A.

The reactance circuit 29A is provided at the position where the series-arm resonant circuit 25 is provided in the first embodiment. The reactance circuit 29A is composed of only a reactance element having fixed reactance. The parallel-arm resonant circuit 24A is connected to the input-output terminal Pout side of the reactance circuit 29A. The parallel-arm resonant circuit 24A includes a variable reactance element 26A and has the resonant frequency and the anti-resonant frequency capable of being adjusted by controlling the variable reactance element 26A. The parallel-arm resonant circuit 24A has the function to increase the attenuation at the resonant frequency and decrease the attenuation at the anti-resonant frequency in filter characteristics of the variable frequency filter 21A, like the parallel-arm resonant circuit 24.

Accordingly, in the high-frequency filter 10A according to the present embodiment, the fixed frequency filter 22 is composed so as to include the series-arm resonant circuit 28, which does not include the variable reactance element, and the variable frequency filter 21A is composed so as to include the parallel-arm resonant circuits 24 and 24A, each of which includes the variable reactance element, and the reactance circuit 29A connected between the parallel-arm resonant circuits 24 and 24A.

As described in the present embodiment, the high-frequency filter 10A may have the configuration in which the variable frequency filter includes the multiple resonant circuits only on the parallel-arm path.

Third Embodiment

Figure 4:
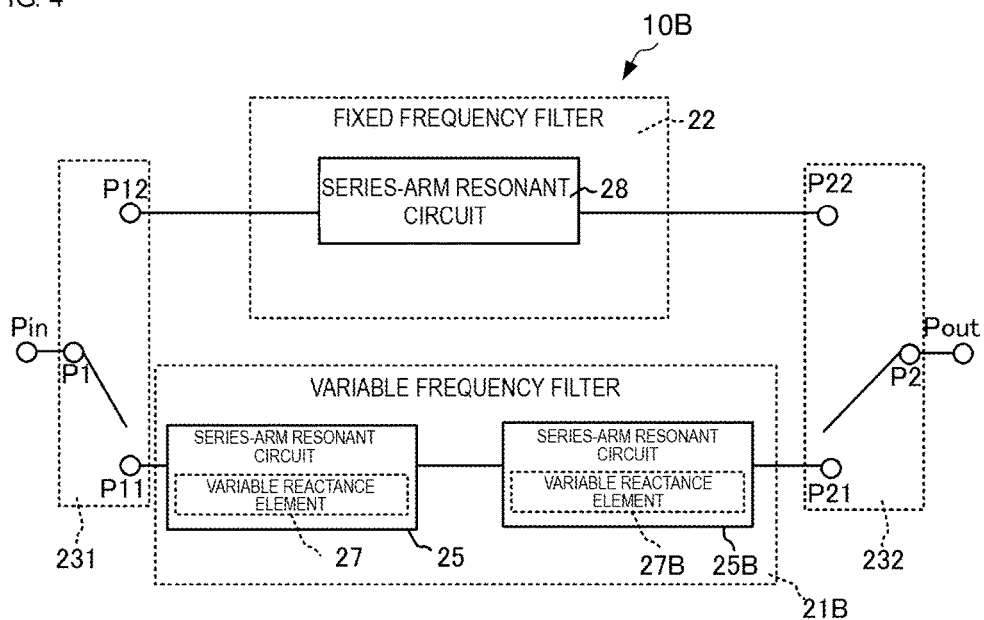
FIG. 4 is a block diagram of a variable filter circuit according to a third embodiment.

FIG. 4 is a block diagram of a high-frequency filter 10B according to a third embodiment of the present disclosure.

The high-frequency filter 10B includes a variable frequency filter 21B, as a component different from the components in the first embodiment. The variable frequency filter 21B includes the series-arm resonant circuit 25 and a series-arm resonant circuit 25B.

The series-arm resonant circuit 25B is connected between the series-arm resonant circuit 25 and the connection switching terminal P21 of the switch 232. The series-arm resonant circuit 25B includes a variable reactance element 27B and has the resonant frequency and the anti-resonant frequency capable of being adjusted by controlling the variable reactance element 27B. The series-arm resonant circuit 25B has the function to decrease the attenuation at the resonant frequency and increase the attenuation at the anti-resonant frequency in the filter characteristics of the variable frequency filter 21B, like the series-arm resonant circuit 25.

Accordingly, in the high-frequency filter 10B according to the present embodiment, the fixed frequency filter 22 is composed so as to include the series-arm resonant circuit 28, which does not include the variable reactance element, and the variable frequency filter 21B is composed so as to include the series-arm resonant circuits 25 and 25B, each of which includes the variable reactance element.

As described in the present embodiment, the high-frequency filter 10B may have the configuration in which the variable frequency filter includes the multiple resonant circuits only on the series-arm path.

Fourth Embodiment

Figure 5:
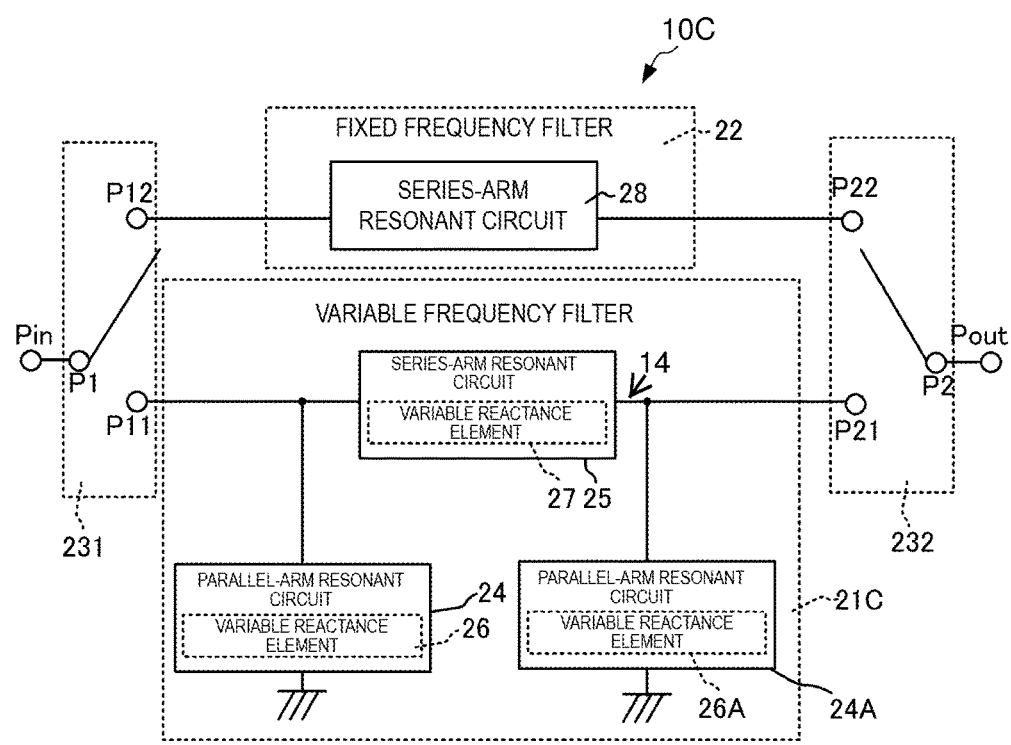
FIG. 5 is a block diagram of a variable filter circuit according to a fourth embodiment.

FIG. 5 is a block diagram of a high-frequency filter 10C according to a fourth embodiment of the present disclosure.

The high-frequency filter 10C includes a variable frequency filter 21C, as a component different from the components in the first embodiment. The variable frequency filter 21C includes the parallel-arm resonant circuit 24A described in the second embodiment, as a component different from the components in the first embodiment.

Specifically, the variable frequency filter 21C includes one series-arm resonant circuit 25 provided on the series-arm path 14 and the two parallel-arm resonant circuits 24 and 24A connected to both side of the series-arm resonant circuit 25 to have a 7c-shaped circuit configuration.

Accordingly, in the high-frequency filter 10C according to the present embodiment, the fixed frequency filter 22 is composed so as to include the series-arm resonant circuit 28, which does not include the variable reactance element, and the variable frequency filter 21C is composed so as to includes the series-arm resonant circuit 25, which includes the variable reactance element, and the parallel-arm resonant circuits 24 and 24A, each of which includes the variable reactance element.

As described in the present embodiment, the variable frequency filter may be composed so as to include two or more resonant circuits in the high-frequency filter 10C.

Fifth Embodiment

Figure 6:
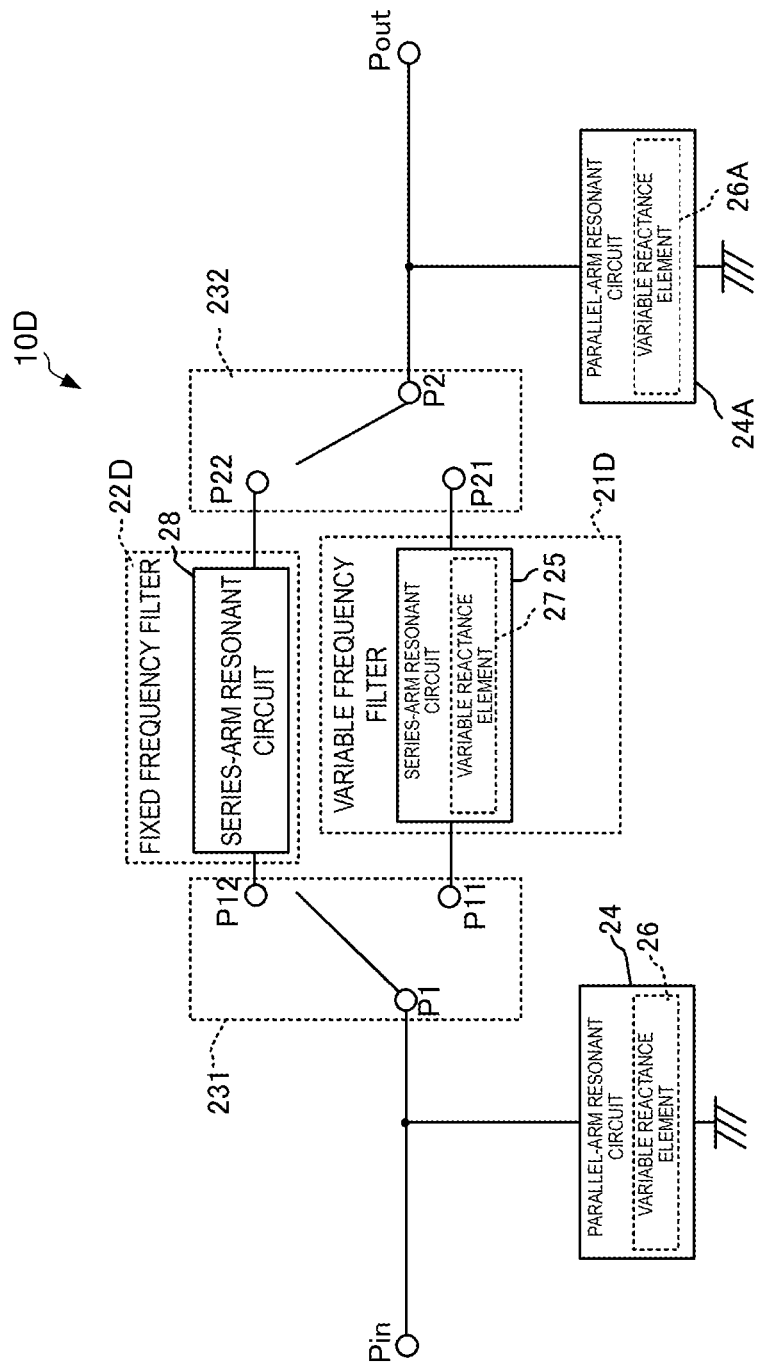
FIG. 6 is a block diagram of a variable filter circuit according to a fifth embodiment.

FIG. 6 is a block diagram of a high-frequency filter 10D according to a fifth embodiment of the present disclosure.

The high-frequency filter 10D includes a variable frequency filter 21D and a fixed frequency filter 22D, as components different from the components in the fourth embodiment. The switches 231 and 232 are arranged at positions different from the positions thereof in the fourth embodiment.

A switching unit 23D (switches 231, 232) is provided at a position, which is a connection point between the parallel-arm resonant circuits 24 and 24A and the series-arm resonant circuit 25 when the variable frequency filter 21D is used. Accordingly, in the high-frequency filter 10D, the parallel-arm resonant circuit 24 and the parallel-arm resonant circuit 24A are connected on both sides of the series-arm resonant circuit 28 when the fixed frequency filter 22D is used. The parallel-arm resonant circuit 24 and the parallel-arm resonant circuit 24A are shared between the variable frequency filter 21D and the fixed frequency filter 22D.

Consequently, in the high-frequency filter 10D according to the present embodiment, the fixed frequency filter 22D is composed so as to includes the first series-arm resonant circuit 28, which does not include the variable reactance element, and the parallel-arm resonant circuits 24 and 24A, each of which includes the variable reactance element, and the variable frequency filter 21D is composed so as to includes the second series-arm resonant circuit 25, which includes the variable reactance element, and the parallel-arm resonant circuits 24 and 24A, each of which includes the variable reactance element.

As described in this embodiment, part of the resonant circuits may be shared between the variable frequency filter 21D and the fixed frequency filter 22D in the high-frequency filter 10D. In this case, the resonant circuits include the variable reactance elements when the high-frequency filter 10D is used as the fixed frequency filter. However, since no variable reactance element is included in the circuit portion connected in series between the input-output terminals Pin and Pout, degradation of the filter characteristics caused by the inclusion of the variable reactance element is suppressed. In addition, such a configuration enables the filter characteristics to be fine-tuned when the high-frequency filter 10D is specified and used as the fixed frequency filter.

Sixth Embodiment

Figure 7:
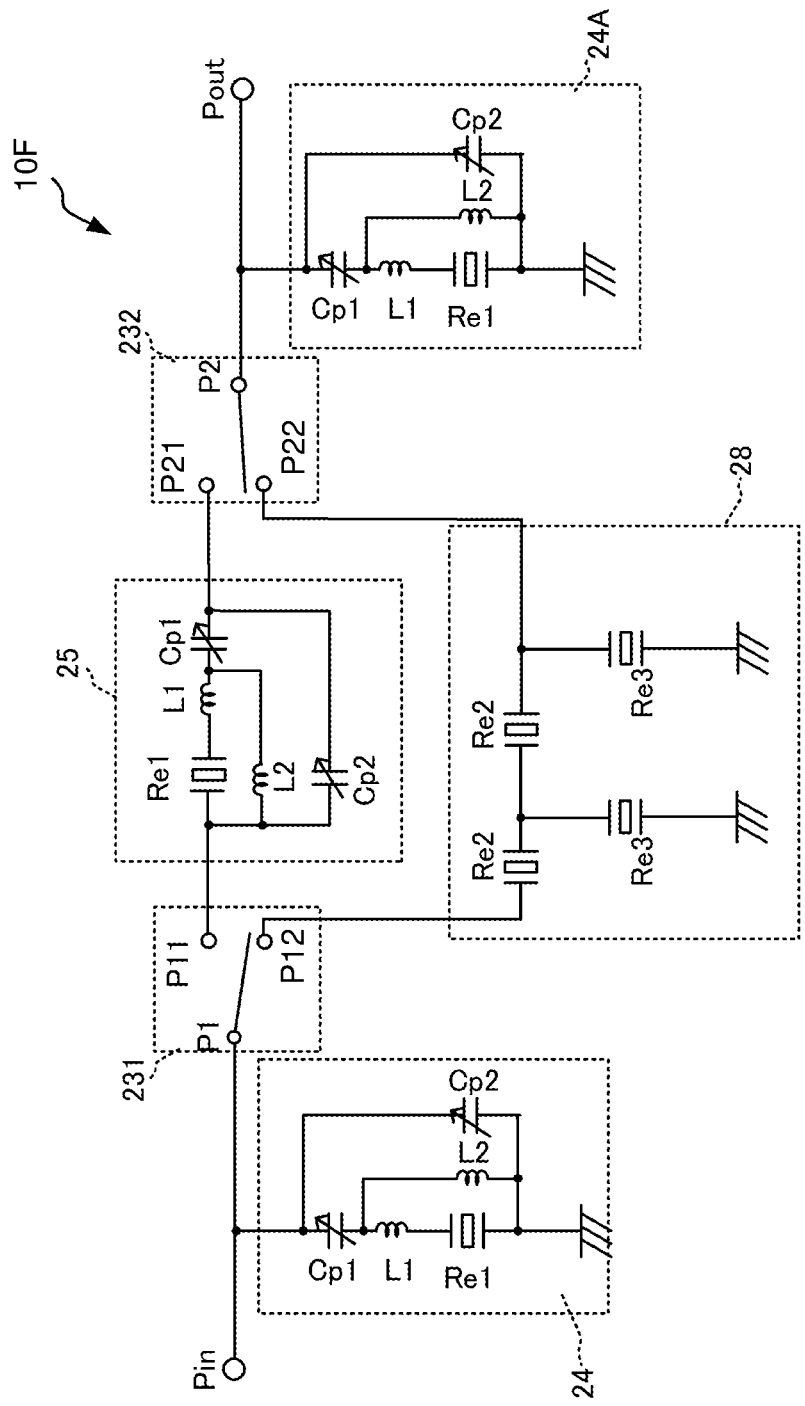
FIG. 7 is a circuit diagram of the variable filter circuit according to the first embodiment.

FIG. 7 is a circuit diagram of a high-frequency filter 10F according to a sixth embodiment.

The high-frequency filter 10F according to the sixth embodiment embodies the fifth embodiment described above. Specifically, the high-frequency filter 10F includes the series-arm resonant circuit 28 composing part of the fixed frequency filter, the series-arm resonant circuit 25 composing part of the variable frequency filter, and the parallel-arm resonant circuits 24 and 24A shared between the fixed frequency filter and the variable frequency filter.

The series-arm resonant circuit 28 includes two resonators Re2 and two resonators Re3. The two resonators Re2 are connected in series between the connection switching terminals P21 and P12. The two resonators Re3 are connected in series between the fixed frequency filter 22 side of the respective resonators Re2 connected in series to each other and the ground. The resonators Re2 and the resonators Re3 are alternately connected to form a ladder structure.

The series-arm resonant circuit 28 has a function to decrease the attenuation at the resonant frequency of the resonators Re2 and the anti-resonant frequency of the resonators Re3 and a function to increase the attenuation at the anti-resonant frequency of the resonators Re2 and the resonant frequency of the resonators Re3 in the filter characteristics of the high-frequency filter 10F. Accordingly, setting the resonant frequency of the resonators Re2 and the anti-resonant frequency of the resonators Re3 so as to close to each other provides the passband in the filter characteristics of the high-frequency filter 10F. In addition, setting the anti-resonant frequency of the resonators Re2 and the resonant frequency of the resonators Re3 near the low frequency side of the passband and near the high frequency side of the passband provides the attenuation poles near the low frequency side of the passband and near the high frequency side of the passband. Since the series-arm resonant circuit 28 does not include the reactance element, such as the variable reactance element, the filter characteristics of the entire series-arm resonant circuit 28 are set to have a wide passband and excellent attenuation characteristics.

Although the series-arm resonant circuit 28 may include the multiple resonators, as described above, the series-arm resonant circuit 28 may be configured as a filter having another well-known structure. For example, the series-arm resonant circuit 28 may be configured as a bandpass surface acoustic wave (SAW) filter or a bandpass bulk acoustic wave (BAW) filter.

The series-arm resonant circuit 25 has the same circuit configuration as those of the parallel-arm resonant circuits 24 and 24A. Specifically, the series-arm resonant circuit 25 and the parallel-arm resonant circuits 24 and 24A each include a resonator Re1, variable capacitors Cp1 and Cp2, and inductors L1 and L2.

The resonator Re1 is connected in series to a main path in each of the series-arm resonant circuit 25 and the parallel-arm resonant circuits 24 and 24A. The inductor L1 is connected in series to the resonator Re1 on the main path in each of the series-arm resonant circuit 25 and the parallel-arm resonant circuits 24 and 24A. The inductor L2 is connected in parallel to a series circuit composed of the resonator Re1 and the inductor L1 in each of the series-arm resonant circuit 25 and the parallel-arm resonant circuits 24 and 24A. The variable capacitor Cp1 is connected in series to a circuit composed of the inductor L2, the resonator Re1, and the inductor L1 on the main path in each of the series-arm resonant circuit 25 and the parallel-arm resonant circuits 24 and 24A. The variable capacitor Cp2 is connected in parallel to a circuit composed of the inductor L2, the resonator Re1, the inductor L1, and the variable capacitor Cp1 in each of the series-arm resonant circuit 25 and the parallel-arm resonant circuits 24 and 24A.

The resonator Re1 has the resonant frequency and the anti-resonant frequency. The inductors L1 and L2 have a function to shift the resonant frequency and the anti-resonant frequency to different frequencies so as to increase the spacing between the resonant frequency and the anti-resonant frequency of the resonator Re1 in the impedance characteristics of the series-arm resonant circuit 25 and the parallel-arm resonant circuits 24 and 24A. The capacitances of the variable capacitors Cp1 and Cp2 are varied. The variable capacitor Cp1 has a function to shift the anti-resonant frequency to a different frequency in the impedance characteristics of the series-arm resonant circuit 25 and the parallel-arm resonant circuits 24 and 24A. The variable capacitor Cp2 has a function to shift the resonant frequency to a different frequency in the impedance characteristics of the series-arm resonant circuit 25 and the parallel-arm resonant circuits 24 and 24A.

In each of the series-arm resonant circuit 25 and the parallel-arm resonant circuits 24 and 24A configured in the above manner, the resonant frequency and the anti-resonant frequency are capable of being adjusted by controlling the variable capacitors Cp1 and Cp2 near the frequency range between the resonant frequency and the anti-resonant frequency of the resonator Re1, the spacing between which is increased with the inductors L1 and L2.

The series-arm resonant circuit 25 and the parallel-arm resonant circuits 24 and 24A have a function to decrease the attenuation at the resonant frequency in the series-arm resonant circuit 25 and the anti-resonant frequency in the parallel-arm resonant circuits 24 and 24A in the filter characteristics of the high-frequency filter 10F. Accordingly, adjusting the resonant frequency in the series-arm resonant circuit 25 and the anti-resonant frequency in the parallel-arm resonant circuits 24 and 24A so as to be close to each other provides the passband in the filter characteristics of the high-frequency filter 10F.

The series-arm resonant circuit 25 and the parallel-arm resonant circuits 24 and 24A have a function to increase the attenuation at the anti-resonant frequency in the series-arm resonant circuit 25 and the resonant frequency in the parallel-arm resonant circuits 24 and 24A in the filter characteristics of the high-frequency filter 10F. Accordingly, adjusting the anti-resonant frequency in the series-arm resonant circuit 25 and the resonant frequency in the parallel-arm resonant circuits 24 and 24A to frequencies near the passband produces the attenuation pole near the passband in the filter characteristics of the high-frequency filter 10F.

Accordingly, the high-frequency filter 10F has the passband and the attenuation pole the frequencies of which are capable of being adjusted by controlling the variable capacitors Cp1 and Cp2 provided in the series-arm resonant circuit 25 and the parallel-arm resonant circuits 24 and 24A when the high-frequency filter 10F is used as the variable frequency filter.

The high-frequency filter 10F achieves excellent attenuation characteristics near the passband using the fixed passband and attenuation pole of the series-arm resonant circuit 28 when the high-frequency filter 10F is used as the fixed frequency filter. In addition, since the parallel-arm resonant circuits 24 and 24A are shared also when the high-frequency filter 10F is used as the fixed frequency filter, the filter characteristics are capable of being fine-tuned by controlling the variable capacitors Cp1 and Cp2 in the parallel-arm resonant circuits 24 and 24A.

Figure 8:
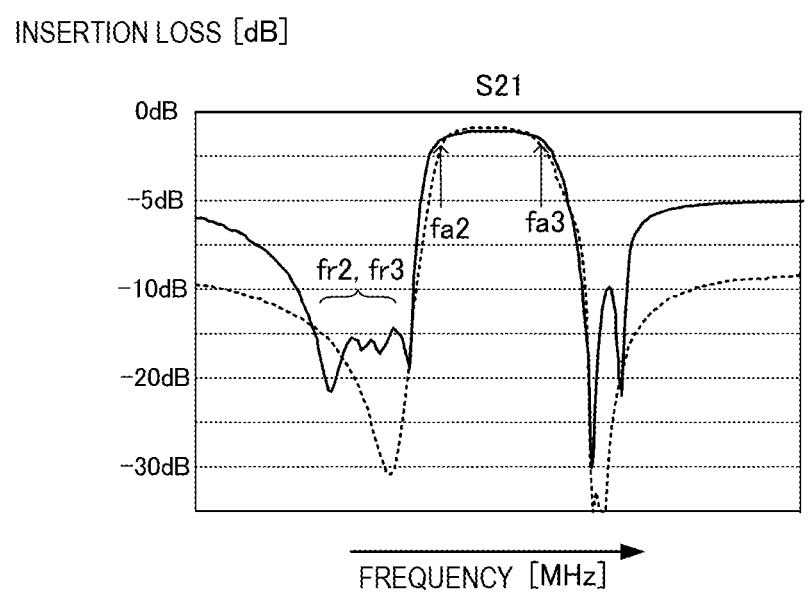
FIG. 8 is a characteristic diagram of the variable filter circuit according to the first embodiment.

FIG. 8 is a characteristic diagram illustrating exemplary filter characteristics when the high-frequency filter 10F is used as the fixed frequency filter. The filter characteristics of only the fixed frequency filter 22 are also illustrated in FIG. 8 using a broken line.

Although the approximate center frequency and the bandwidth of the passband and the approximate frequency of the attenuation pole are determined based on the fixed filter characteristics of the series-arm resonant circuit 28 in the filter characteristics in the high-frequency filter 10F at this time, the frequencies of the passband and the attenuation pole are capable of being fine-tuned by adjusting resonant frequencies fr2 and fr3 and anti-resonant frequencies fa2 and fa3 in the parallel-arm resonant circuits 24 and 24A. The variable widths of the passband and the attenuation pole, which are capable of being adjusted when the high-frequency filter 10F is used as the fixed frequency filter, are markedly narrower than the variable widths of the passband and the attenuation pole, which are capable of being adjusted when the high-frequency filter 10F is used as the variable frequency filter. Specifically, the frequencies are adjusted so as to support the multiple communication bands when the high-frequency filter 10F is used as the variable frequency filter while the frequencies are fine-tuned within the frequency range of a specific communication band when the high-frequency filter 10F is used as the fixed frequency filter. The fine-tuning within the frequency range of the specific communication band when the high-frequency filter 10F is used as the fixed frequency filter is very effective in improvement of the filter characteristics when the high-frequency filter 10F is used as the fixed frequency filter.

For example, as illustrated in FIG. 8, adjusting the resonant frequencies fr2 and fr3 in the parallel-arm resonant circuits 24 and 24A to frequencies near the attenuation pole of the fixed frequency filter 22 enables an area where the attenuation is large near the attenuation pole to be widened. For example, as illustrated in FIG. 8, providing the anti-resonant frequencies fa2 and fa3 in the parallel-arm resonant circuits 24 and 24A near the cutoff frequency in the passband of the fixed frequency filter 22 makes the attenuation characteristics near the passband sharp and improves the bandpass characteristics near the cutoff frequency in the passband.

This conversely means that, when required filter characteristics are sufficiently achieved in the filter characteristics of the high-frequency filter 10F, it is possible to reduce the number of the resonators composing the fixed frequency filter 22. In other words, connecting the parallel-arm resonant circuits 24 and 24A to the fixed frequency filter 22 when the fixed frequency filter 22 is used, as in the high-frequency filter 10F of the present embodiment, reduces the fixed frequency filter 22 and the entire high-frequency filter 10F in size.

As described above, in the high-frequency filter of the present disclosure, composing the fixed frequency filter using the parallel-arm resonant circuits each including the variable reactance element enables the filter characteristics of the high-frequency filter to be fine-tuned when the high-frequency filter is used as the fixed frequency filter and, thus, desired filter characteristics are capable of being easily realized, compared with the related art. Sharing the parallel-arm resonant circuits between the variable frequency filter and the fixed frequency filter enables the fine-tuning of the filter characteristics in the fixed frequency filter without necessarily increasing the circuit size.

Seventh Embodiment

Figure 9:
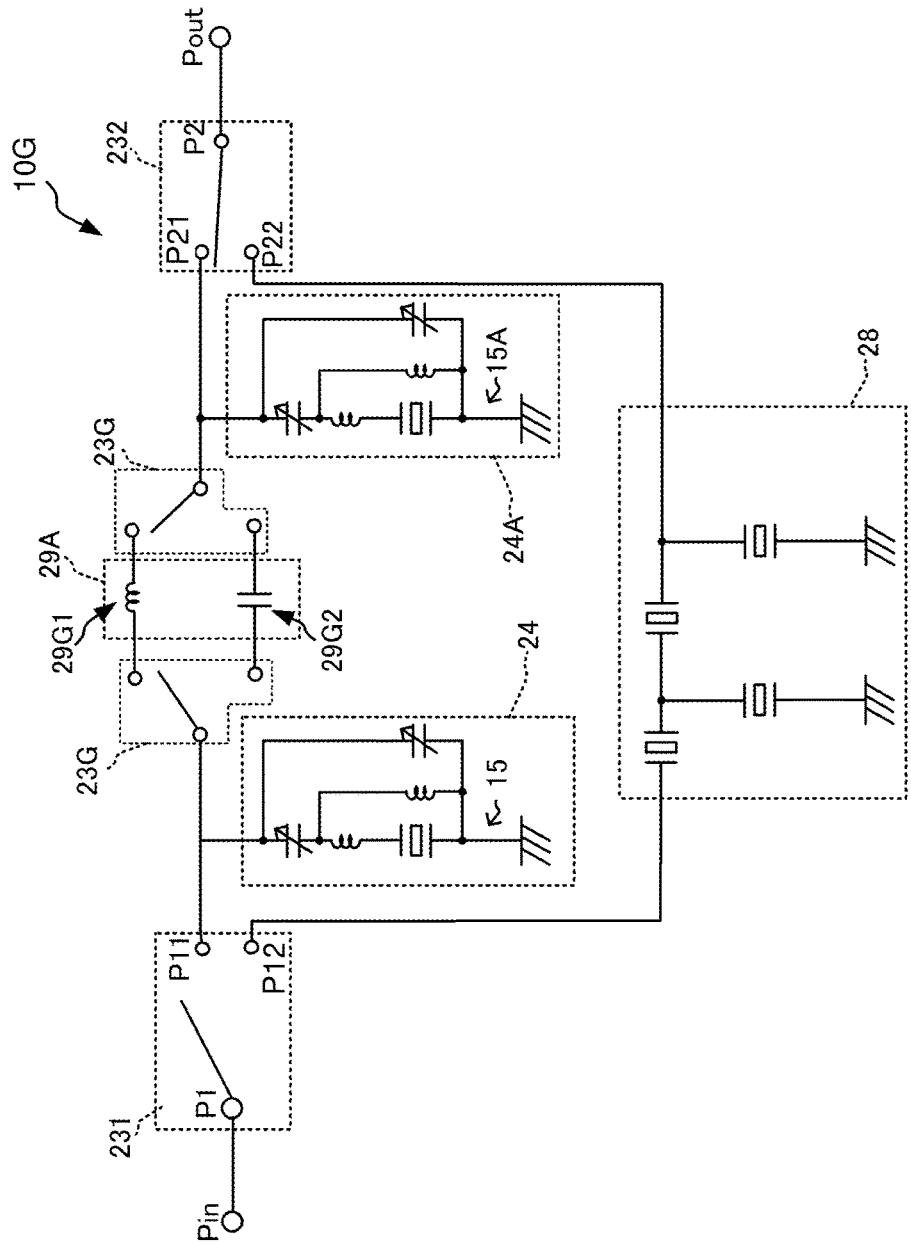
FIG. 9 is a circuit diagram of the variable filter circuit according to the second embodiment.

FIG. 9 is a circuit diagram of a high-frequency filter 10G according to a seventh embodiment.

The high-frequency filter 10G according to the seventh embodiment embodies the second embodiment described above. Specifically, the high-frequency filter 10G includes the series-arm resonant circuit 28 composing the fixed frequency filter and the parallel-arm resonant circuits 24 and 24A and the reactance circuit 29A composing the variable frequency filter. In the high-frequency filter 10G, the reactance circuit 29A includes switches 23G, an inductor 29G1, and a capacitor 29G2. The inductor 29G1 and the capacitor 29G2 are selectively connected via the switches 23G.

The high-frequency filter 10G is capable of selecting connection to the inductor 29G1 or connection to the capacitor 29G2 by controlling the switches 23G when the high-frequency filter 10G is used as the variable frequency filter. The connection between the parallel-arm resonant circuits 24 and 24A via either of the capacitive and inductive reactance elements in the above manner enables a state to be adjusted, in which the characteristics of the high-frequency filter 10G are biased so as to be close to high-pass characteristics or so as to be close to low-pass characteristics.

Eighth Embodiment

Figure 10:
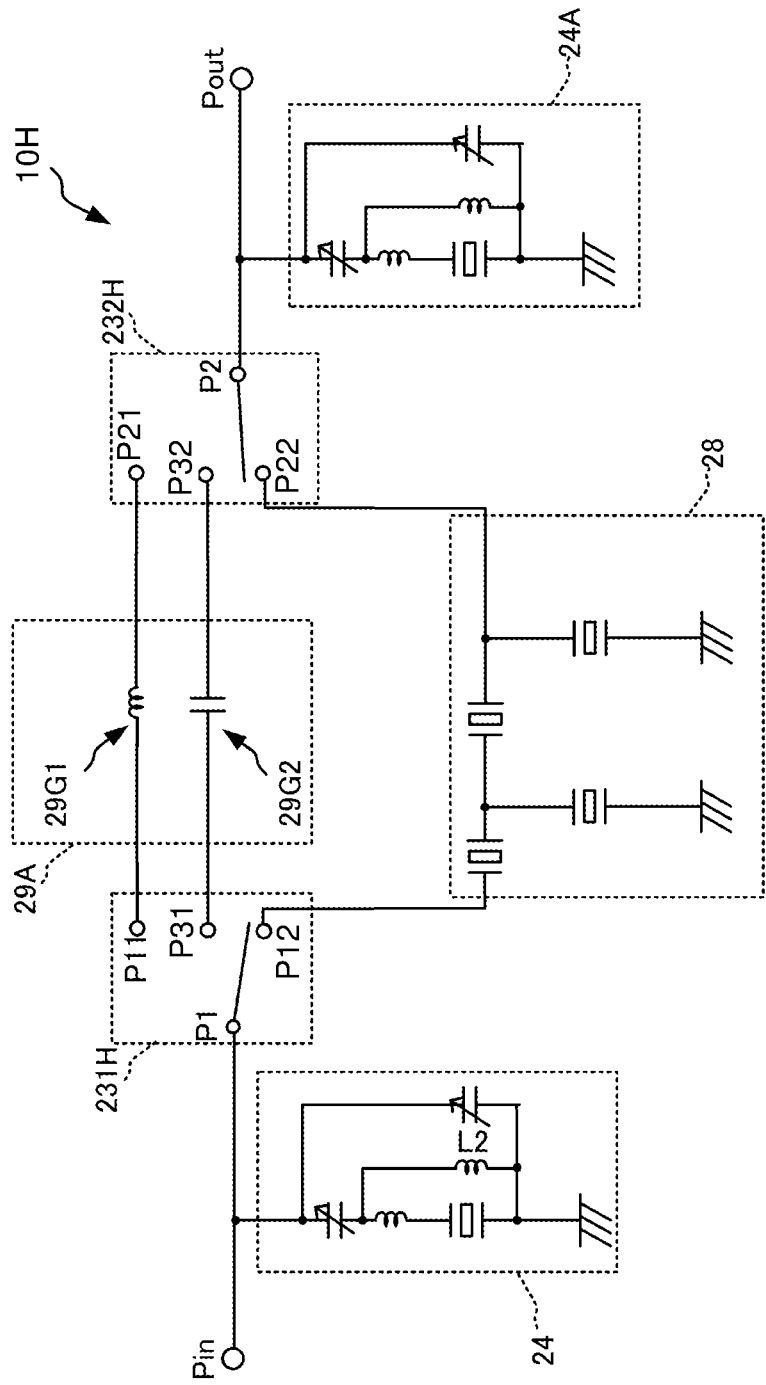
FIG. 10 is a circuit diagram of the variable filter circuit according to the third embodiment.

FIG. 10 is a circuit diagram of a high-frequency filter 10H according to an eighth embodiment.

The high-frequency filter 10H according to the eighth embodiment is a modification of the seventh embodiment described above. The high-frequency filter 10H according to the eighth embodiment has a configuration in which the parallel-arm resonant circuits 24 and 24A are shared between when the high-frequency filter 10H is used as the fixed frequency filter and when the high-frequency filter 10H is used as the variable frequency filter. Although the inductor 29G1 and the capacitor 29G2 are provided in the eighth embodiment, as in the seventh embodiment described above, the switches 23G are not provided and switches 231H and 232H have the function of the switches 23G in the high-frequency filter 10H. Specifically, connection is switched between the inductor 29G1, the capacitor 29G2, and the series-arm resonant circuit 28 using the switches 231H and 232H. With the above configuration, the number of the switches in the high-frequency filter 10H is made smaller than that in the high-frequency filter 10G according to the seventh embodiment described above and, thus, reducing the circuit size.

Ninth Embodiment

Figure 11:
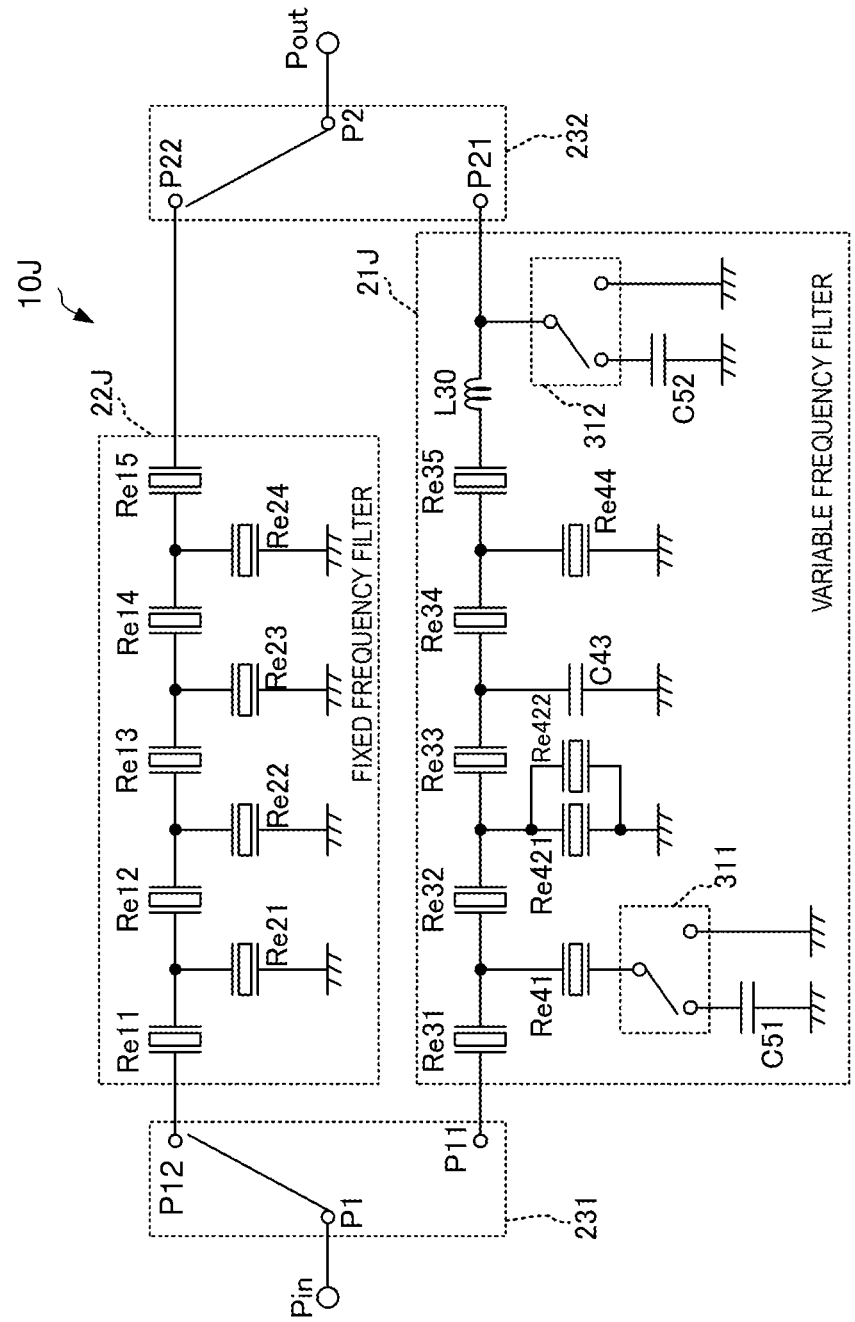
FIG. 11 is a circuit diagram of a high-frequency filter 10J according to a ninth embodiment.

FIG. 11 is a circuit diagram of a high-frequency filter 10J according to a ninth embodiment.

The high-frequency filter 10J according to the present embodiment includes the input-output terminals Pin and Pout, a variable frequency filter 21J, a fixed frequency filter 22J, and the switches 231 and 232. Either of the variable frequency filter 21J and the fixed frequency filter 22J is selectively connected between the input-output terminals Pin and Pout through control of switching between the switches 231 and 232 in the high-frequency filter 10J.

The variable frequency filter 21J includes multiple resonators Re31, Re32, Re33, Re34, Re35, Re41, Re421, Re422, and Re44, capacitors C43, C51, and C52, an inductor L30, and switches 311 and 312. The capacitances of the capacitors C43, C51, and C52 are fixed.

The multiple resonators Re31, Re32, Re33, Re34, and Re35 are connected in series to each other between the connection switching terminal P11 of the switch 231 and the connection switching terminal P21 of the switch 232. The inductor L30 is connected between the resonator Re35 and the connection switching terminal P21.

The connection point between the resonator Re31 and the resonator Re32 is connected to the switch 311 via the resonator Re41. The switch 311 selects a mode in which the resonator Re41 is grounded via the capacitor C51 or a mode in which the resonator Re41 is directly grounded through external switching control. This realizes the function similar to that of the variable capacitor.

The connection point between the resonator Re32 and the resonator Re33 is grounded via a parallel circuit composed of the resonator Re421 and the resonator Re422. The connection point between the resonator Re33 and the resonator Re34 is grounded via the capacitor C43. The connection point between the resonator Re34 and the resonator Re35 is grounded via the resonator Re44.

The connection switching terminal P21 side of the inductor L30 is connected to the switch 312. The switch 312 selects a mode in which the connection switching terminal P21 side of the inductor L30 is grounded via the capacitor C52 or a mode in which the connection switching terminal P21 side of the inductor L30 is opened through external switching control. This realizes the function similar to that of the variable capacitor.

A circuit portion excluding the switches 311 and 312 and the capacitors C51 and C52 in the variable frequency filter 21J corresponds to a "first circuit portion" of the present disclosure. A circuit that is selectively connected to the capacitor C51 with the switch 311 and a circuit that is selectively connected to the capacitor C52 with the switch 312 correspond to a "second circuit portion" of the present disclosure.

The fixed frequency filter 22J includes multiple resonators Re11, Re12, Re13, Re14, Re15, Re21, Re22, Re23, and Re24. The multiple resonators Re11, Re12, Re13, Re14, and Re15 are connected in series to each other between the connection switching terminal P12 of the switch 231 and the connection switching terminal P22 of the switch 232. The connection point between the resonator Re11 and the resonator Re12 is grounded via the resonator Re21. The connection point between the resonator Re12 and the resonator Re13 is grounded via the resonator Re22. The connection point between the resonator Re13 and the resonator Re14 is grounded via the resonator Re23. The connection point between the resonator Re14 and the resonator Re15 is grounded via the resonator Re24.

The high-frequency filter 10J having the above configuration has filter characteristics corresponding to the communication band Band20 and a communication band Band28. Specifically, the fixed frequency filter 22J has filter characteristics corresponding to the communication band Band20. The variable frequency filter 21J has filter characteristics corresponding to the communication band Band28.

The communication band Band28 is composed of a communication band Band28A and a communication band Band28B the used frequency bands of which are partially overlapped with each other. The used frequency band of the communication band Band28A is toward lower frequencies, compared with the used frequency band of the communication band Band28B.

When the variable frequency filter 21J is associated with the communication band Band28B, the resonator Re41 is grounded via the capacitor C51 using the switch 311 and the connection switching terminal P21 side of the inductor L30 is grounded via the capacitor C52 using the switch 312.

Although spurious regulation "NS17" is made at the low frequency side of the communication band Band28B, the provision of the configuration of the variable frequency filter 21J meets this spurious regulation. Although spurious regulation "NS18" is made at the low frequency side of the communication band Band28A, the provision of the configuration of the variable frequency filter 21J meets this spurious regulation.

As described above, the use of the configuration of the high-frequency filter 10J enables the filter characteristics having low-loss bandpass characteristics to be realized for the two communication bands the used frequency bands of which are overlapped with each other in the variable frequency filter while achieving desired attenuation in the attenuation area. Even when another communication band the frequency of which is apart from the communication bands supported by the variable frequency filter exists, the filtering by the fixed frequency filter is realized for the other communication band. Accordingly, it is possible to suppress an increase in the circuit size while realizing filtering appropriate for each communication band to be subjected to the filtering.

Tenth Embodiment

Figure 12:
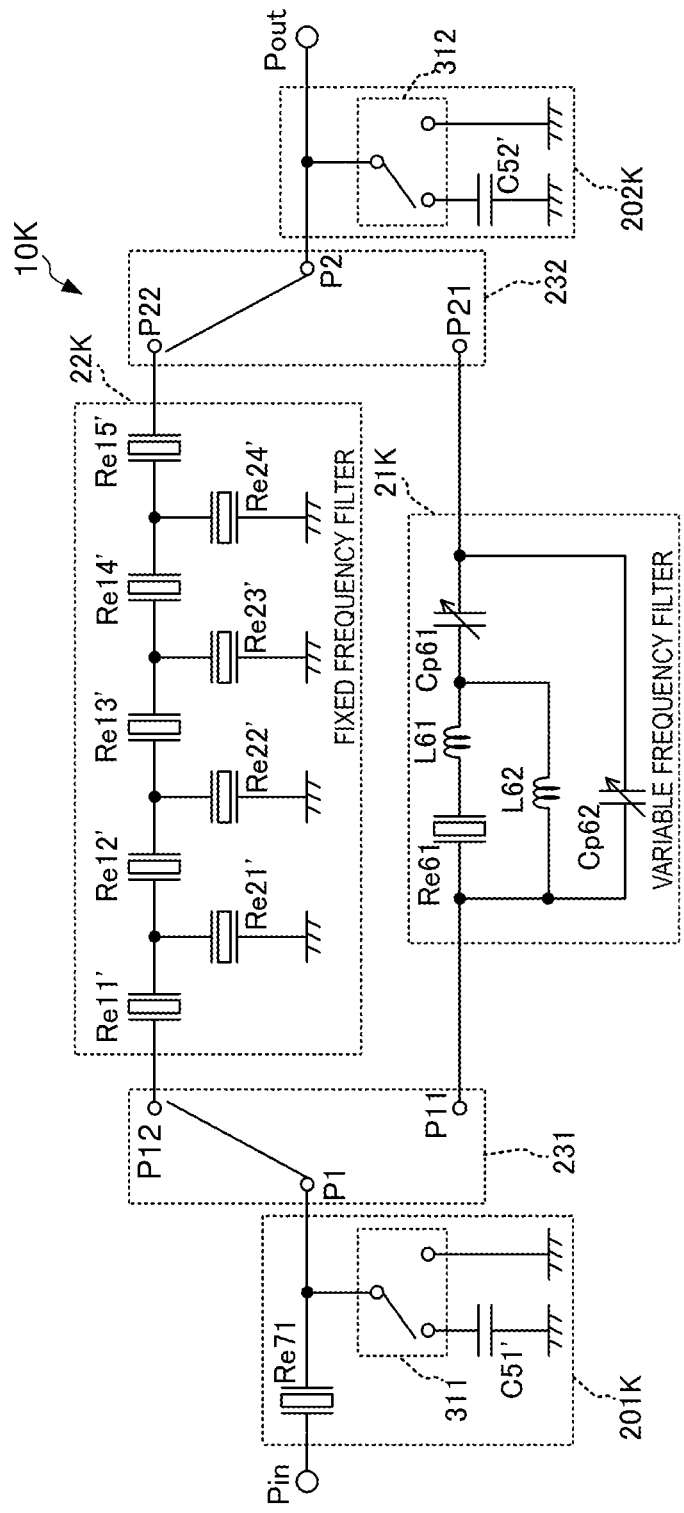
FIG. 12 is a circuit diagram of a high-frequency filter 10K according to a tenth embodiment.

FIG. 12 is a circuit diagram of a high-frequency filter 10K according to a tenth embodiment.

The high-frequency filter 10K according to the present embodiment includes the input-output terminals Pin and Pout, a variable frequency filter 21K, a fixed frequency filter 22K, the switches 231 and 232, and filter characteristics adjusting circuits 201K and 202K. Either of the variable frequency filter 21K and the fixed frequency filter 22K is selectively connected between the input-output terminals Pin and Pout through control of switching between the switches 231 and 232 in the high-frequency filter 10K.

The variable frequency filter 21K includes a resonator Re61, inductors L61 and L62, and variable capacitors CP61 and CP62. The resonator Re61, the inductor L61, and the variable capacitor CP61 are connected in series to each other between the connection switching terminal P11 and the connection switching terminal P21. The inductor L62 is connected in parallel to a series circuit composed of the resonator Re61 and the inductor L61. The variable capacitor CP62 is connected in parallel to a series circuit composed of the resonator Re61, the inductor L61, and the variable capacitor CP61. In other words, the variable frequency filter 21K has the same circuit configuration as that of the series-arm resonant circuit 25 illustrated in FIG. 7 and differs from the series-arm resonant circuit 25 illustrated in FIG. 7 in the element values (inductance, capacitance, and resonance characteristics).

The fixed frequency filter 22K includes multiple resonators Re11', Re12', Re13', Re14', Re15', Re21', Re22', Re23', and Re24'. The multiple resonators Re11', Re12', Re13', Re14', and Re15' are connected in series to each other between the connection switching terminal P12 of the switch 231 and the connection switching terminal P22 of the switch 232. The connection point between the resonator Re11' and the resonator Re12' is grounded via the resonator Re21'. The connection point between the resonator Re12' and the resonator Re13' is grounded via the resonator Re22'. The connection point between the resonator Re13' and the resonator Re14' is grounded via the resonator Re23'. The connection point between the resonator Re14' and the resonator Re15' is grounded via the resonator Re24'.

The filter characteristics adjusting circuit 201K includes a resonator Re71, the switch 311, and a capacitor C51'. The capacitance of the capacitor C51' is fixed. The resonator Re1 is connected between the input-output terminal Pin and the common terminal P1 of the switch 231. The switch 311 selects a mode in which the common terminal P1 is grounded via the capacitor C51' or a mode in which the common terminal P1 is directly grounded through external switching control.

The filter characteristics adjusting circuit 202K includes the switch 312 and a capacitor C52'. The capacitance of the capacitor C52' is fixed. The switch 312 selects a mode in which the common terminal P2 is grounded via the capacitor C52' or a mode in which the common terminal P2 is opened through external switching control.

The high-frequency filter 10K having the above configuration has filter characteristics corresponding to a communication band Band12 or a communication band Band17 and the communication band Band28. Specifically, when the high-frequency filter 10K is associated with the communication band Band28, the common terminal P1 is connected to the connection switching terminal P12 in the switch 231 and the common terminal P2 is connected to the connection switching terminal P22 in the switch 232. This realizes the same circuit configuration as that of the fixed frequency filter 22J in the high-frequency filter 10J described in the ninth embodiment. When the high-frequency filter 10K is associated with the communication band Band12 or the communication band Band17, the common terminal P1 is connected to the connection switching terminal P11 in the switch 231 and the common terminal P2 is connected to the connection switching terminal P12 in the switch 232. Adjusting the capacitances of the variable capacitors CP61 and CP62 in the variable frequency filter 21K realizes the filter characteristics for the communication band Band12 or the filter characteristics for the communication band Band17.

With the above configuration, a combination of the fixed frequency filter 22K and the filter characteristics adjusting circuits 201K and 202K enables the bandpass characteristics and the attenuation characteristics of the communication band Band28A and the bandpass characteristics and the attenuation characteristics of the communication band Band28B to be separately met while meeting the insertion loss for both the communication band Band28A and the communication band Band28B. In addition, the filter characteristics meeting the two communication bands Band12 and Band17 are realized with the variable frequency filter 21K. Accordingly, it is possible to suppress an increase in the circuit size while realizing filtering appropriate for each communication band to be subjected to the filtering.

Eleventh Embodiment

Figure 13:
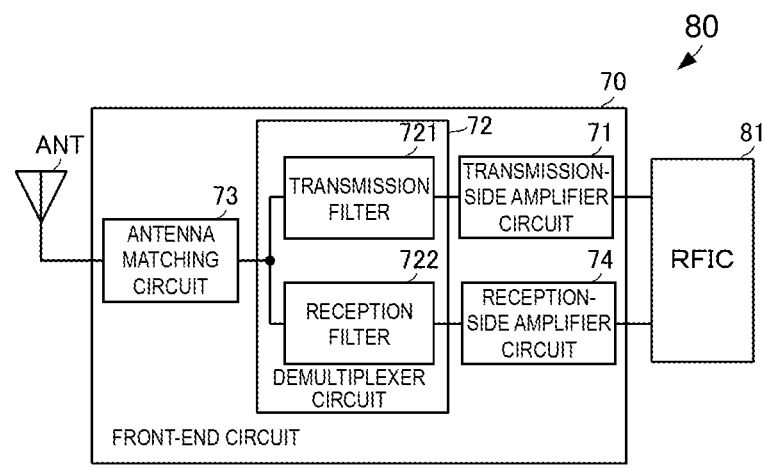
FIG. 13 is a functional block diagram of a communication device according to an eleventh embodiment.

FIG. 13 is a functional block diagram of a communication device according to an eleventh embodiment.

A communication device 80 includes a front-end circuit 70 and a radio frequency integrated circuit (RFIC) 81. The front-end circuit 70 includes a transmission-side amplifier circuit 71, a demultiplexer circuit 72, an antenna matching circuit 73, and a reception-side amplifier circuit 74. The demultiplexer circuit 72 includes a transmission filter 721 and a reception filter 722. The transmission filter 721 and the reception filter 722 are connected to the antenna matching circuit 73, and the antenna matching circuit 73 is connected to an antenna ANT. The transmission filter 721 is connected to the transmission-side amplifier circuit 71. The reception filter 722 is connected to the reception-side amplifier circuit 74. The transmission-side amplifier circuit 71 and the reception-side amplifier circuit 74 are connected to the RFIC 81.

The RFIC 81 generates a transmission signal using the frequency band of a specified communication band. The RFIC 81 supplies a switch control signal to the transmission filter 721 and the reception filter 722 in the demultiplexer circuit 72 in accordance with the specified communication band. The transmission filter 721 and the reception filter 722 are each formed of any of the high-frequency filter described in the above embodiments and perform switching control in accordance with the switch control signal.

The transmission signal output from the RFIC 81 is amplified in the transmission-side amplifier circuit 71. The transmission-side amplifier circuit 71 includes, for example, a power amplifier (PA) and amplifies the transmission signal. The amplified transmission signal is supplied to the transmission filter 721 in the demultiplexer circuit 72. The transmission signal is subjected to the filtering in the transmission filter 721 and is supplied to the antenna ANT via the antenna matching circuit 73. Here, providing the configuration of any of the high-frequency filters described above to the variable frequency filter 21 enables the transmission signal to be transmitted with low loss using the specified communication band and enables spurious waves, such as harmonic waves, generated in the transmission-side amplifier circuit 71 to be reliably attenuated. Accordingly, it is possible to meet the regulations concerning the spurious waves, such as spurious emission regulation, without necessarily externally transmitting unnecessary high-frequency signals in the communication bands other than the specified communication band.

A reception signal received by the antenna ANT is supplied to the reception filter 722 in the demultiplexer circuit 72 via the antenna matching circuit 73. The reception filter 722 performs the filtering of the reception signal and supplies the reception signal to the reception-side amplifier circuit 74. The reception-side amplifier circuit 74 includes, for example, a low noise amplifier (LNA). The reception-side amplifier circuit 44 amplifies the reception signal and supplies the reception signal to the RFIC 81.

With the above configuration, it is possible to realize the front-end circuit 70 and the communication device 80, which enables the communication with low loss using the specified communication band and which meets the regulations concerning the spurious waves. In addition, the use of any of the high-frequency filters described above suppresses an increase in the circuit sizes of the front-end circuit 70 and the communication device 80 while realizing the filtering appropriate for each communication band.

The present invention is embodied in the manners described in the above embodiments and examples. The present invention is embodied with any configuration other than the configurations described in the above embodiments and examples as long as the configuration is within the spirit and scope of the appended claims.

For example, the variable reactance element is not limited to a variable capacitance and may be an element or a circuit having variable inductive reactance. The high-frequency module may be configured as a variable filter circuit module in which only the variable filter circuit is formed on the substrate or may be configured as an analog signal processing module integrated with another circuit concerning the high-frequency signal processing, such as a duplexer, a diplexer, or an amplifier. The variable filter circuit of the present invention may have a module configuration integrally formed on the substrate or may be a signal processing apparatus in which multiple components are connected.

REFERENCE SIGNS LIST

Cp1, Cp2 variable capacitor
L1, L2 inductor
P1, P2 common terminal
P11, P21, P12, P22 connection switching terminal
Pin, Pout input-output terminal
Re1, Re2, Re3, Re11, Re12, Re13, Re14, Re15, Re21, Re22, Re23, Re24, Re31, Re32, Re33, Re34, Re35, Re41, Re421, Re422, Re44, Re61, Re11', Re12', Re13', Re14', Re15', Re21', Re22', Re23', Re24' resonator
10, 10A, 10B, 10C, 10D, 10F, 10G, 10H, 10J, 10K high-frequency filter
21, 21A, 21B, 21C, 21D, 21J, 21K variable frequency filter
22, 22J, 22K fixed frequency filter
23G switch
24, 24A parallel-arm resonant circuit
25, 25B, 28 series-arm resonant circuit
26, 27, 26A, 27B variable reactance element
29A reactance circuit
29G1, L30, L61, L62 inductor
29G2, C43, C51, C52 capacitor
70 front-end circuit
71 transmission-side amplifier circuit
72 demultiplexer circuit
73 antenna matching circuit
74 reception-side amplifier circuit
80 communication device
81 RFIC
231, 232, 231H, 232H, 311, 312 switch
721 transmission filter
722 reception filter
CP61, CP62 variable capacitor

The invention claimed is:

1. A high-frequency filter comprising:
   a variable frequency filter configured to vary a passband in accordance with frequencies of a plurality of communication bands;
   a fixed frequency filter configured to fix a passband in accordance with a frequency in a fixed communication band, the fixed communication band not being one of the plurality of communication bands; and
   a switch configured to switch connection of the variable frequency filter or the fixed frequency filter between input and output terminals of the high-frequency filter,
   wherein a gap bandwidth between a transmission band and a reception band of the fixed communication band is narrower than a gap bandwidth between the transmission band and the reception band of each of the plurality of communication bands corresponding to the variable frequency filter.

2. The high-frequency filter according to claim 1, wherein the fixed frequency filter does not include any variable reactance element, and
   wherein the variable frequency filter includes at least one variable reactance element.

3. The high-frequency filter according to claim 2, further comprising:
   at least one filter characteristic adjusting circuit configured to selectively connect a capacitor having a fixed capacitance to the fixed frequency filter or the variable frequency filter,
   wherein the filter characteristic adjusting circuit is connected to at least one end of the fixed frequency filter.

4. The high-frequency filter according to claim 2, wherein the variable frequency filter includes a first circuit portion having basic frequency characteristics and a second circuit portion configured to selectively connect a capacitor to the first circuit portion thereby adjusting the basic frequency characteristics.

5. The high-frequency filter according to claim 1, wherein the fixed frequency filter comprises a first series-arm resonant circuit, the first series-arm resonant circuit not including any variable reactance element,
   wherein the variable frequency filter comprises a second series-arm resonant circuit, the second series-arm resonant circuit including at least one variable reactance element, and
   wherein the fixed frequency filter and the variable frequency filter share a parallel-arm resonant circuit, the parallel-arm resonant circuit including at least one variable reactance element.

6. The high-frequency filter according to claim 1, wherein the fixed frequency filter comprises a first series-arm resonant circuit, the first series-arm resonant circuit not including any variable reactance element,
   wherein the variable frequency filter and the fixed frequency filter share a plurality of parallel-arm resonant circuits, each of the plurality of parallel-arm resonant circuits including at least one variable reactance, and
   wherein the variable frequency filter comprises a reactance circuit to which the plurality of parallel-arm resonant circuits are connected.

7. The high-frequency filter according to claim 6, wherein the reactance circuit comprises a plurality of reactance elements having different reactance values configured to be selectively connected.

8. The high-frequency filter according to claim 1,
wherein the fixed frequency filter comprises a first series-arm resonant circuit, the first series-arm resonant circuit not including any variable reactance element, and
wherein the variable frequency filter comprises a second series-arm resonant circuit, the second series-arm resonant circuit including at least one variable reactance element.

9. The high-frequency filter according to claim 1,
wherein the fixed frequency filter comprises a first series-arm resonant circuit, the first series-arm resonant circuit not including any variable reactance element, and
wherein the variable frequency filter comprises a plurality of parallel-arm resonant circuits, each of the plurality of parallel-arm resonant circuits including at least one variable reactance element, and a reactance circuit to which the plurality of parallel-arm resonant circuits are connected.

10. The high-frequency filter according to claim 9,
wherein the reactance circuit comprises a plurality of reactance elements having different reactance values configured to be selectively connected.

11. The high-frequency filter according to claim 1,
wherein the fixed frequency filter comprises a first series-arm resonant circuit, the first series-arm resonant circuit not including any variable reactance element, and
wherein the variable frequency filter comprises a second series-arm resonant circuit and a parallel-arm resonant circuit, the second series-arm resonant circuit and the parallel-arm resonant circuit each including at least one variable reactance element.

12. The high-frequency filter according to claim 1,
wherein the fixed frequency filter comprises a first series-arm resonant circuit, the first series-arm resonant circuit not including any variable reactance element, and
wherein the variable frequency filter comprises a second series-arm resonant circuit and a third series-arm resonant circuit, the second and third series-arm resonant circuits each including at least one variable reactance element.

13. The high-frequency filter according to claim 1,
wherein the fixed frequency filter comprises a first series-arm resonant circuit, the first series-arm resonant circuit not including any variable reactance element, and
wherein the variable frequency filter comprises a second series-arm resonant circuit and a plurality of parallel-arm resonant circuits, the second series-arm resonant circuit and the plurality of parallel-arm resonant circuits each including at least one variable reactance element.

14. A front-end circuit comprising:
a demultiplexer circuit including a transmission filter configured to filter a transmission signal and a reception filter configured to filter a reception signal;
a transmission-side amplifier circuit connected to the transmission filter; and
a reception-side amplifier circuit connected to the reception filter,
wherein at least one of the transmission filter and the reception filter comprises the high-frequency filter according to claim 1.

15. A communication device comprising:
the front-end circuit according to claim 14; and
a radio frequency integrated circuit that is connected to the transmission-side amplifier circuit and the reception-side amplifier circuit, the radio frequency integrated circuit configured to generate a control signal for the switch.

* * * * *

UNITED STATES PATENT AND TRADEMARK OFFICE
CERTIFICATE OF CORRECTION

PATENT NO.         : 10,224,899 B2
APPLICATION NO.    : 15/718354
DATED              : March 5, 2019
INVENTOR(S)        : Hideki Tsukamoto Page 1 of 1

It is certified that error appears in the above-identified patent and that said Letters Patent is hereby corrected as shown below:

In the Specification

Column 8, Line 33: "7c-shaped circuit configuration." should be -- π-shaped circuit configuration --.

Column 15, Line 31: "resonator Re1" should read -- resonator Re7 --.

Signed and Sealed this
Fourteenth Day of May, 2019

Andrei Iancu
*Director of the United States Patent and Trademark Office*